US006710654B2

(12) United States Patent
Parkhurst et al.

(10) Patent No.: US 6,710,654 B2
(45) Date of Patent: Mar. 23, 2004

(54) BIPOLAR CLASS AB FOLDED CASCODE OPERATIONAL AMPLIFIER FOR HIGH-SPEED APPLICATIONS

(75) Inventors: Charles Parkhurst, Richardson, TX (US); Julio E. Acosta, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/999,475

(22) Filed: Nov. 15, 2001

(65) Prior Publication Data

US 2003/0090321 A1 May 15, 2003

(51) Int. Cl.[7] .................................................. H03F 3/45
(52) U.S. Cl. ....................................... 330/252; 330/255
(58) Field of Search ................................ 330/252, 255, 330/258; 327/349, 361, 561, 359

(56) References Cited

U.S. PATENT DOCUMENTS

| 5,815,039 | A | * | 9/1998 | Kimura | ........................ | 330/252 |
| 5,912,834 | A | * | 6/1999 | Kimura | ........................ | 364/841 |
| 5,933,054 | A | * | 8/1999 | Kimura | ........................ | 330/254 |
| 6,107,858 | A | * | 8/2000 | Kimura | ........................ | 327/349 |

* cited by examiner

*Primary Examiner*—Henry Choe
(74) *Attorney, Agent, or Firm*—W. Daniel Swayze, Jr.; W. James Brady; Frederick J. Telecky, Jr.

(57) ABSTRACT

The present invention (800) comprises an operational amplifier with a first stage comparator circuit (801) for biasing a second stage folded cascode amplifier circuit (802). The result is that the input differential voltage signal to output current signal is transformed from a tanh function to a sinh function. The present invention provides the low noise, low distortion, high gain, wide bandwidth and good DC performance characteristics of the folded cascode op-amp configuration, with much improved slew rate.

17 Claims, 4 Drawing Sheets

BIPOLAR CLASS AB FOLDED CASCODE OPERATIONAL AMPLIFIER FOR HIGH-SPEED APPLICATIONS

TECHNICAL FIELD OF THE INVENTION

This invention relates to amplifiers and in particular, operational amplifiers including class AB amplifiers.

BACKGROUND OF THE INVENTION

High-speed operational amplifiers ("op-amps") that are capable of accepting, amplifying and outputting signals with minimal distortion or noise caused by the amplifier itself, are desirable in analog circuits. There are different op-amp architectures that are suitable for high-speed applications in analog circuits. The two main circuit topologies for voltage feedback op-amps are the folded cascode op-amp and the class AB op-amp. The folded cascode op-amp offers low noise, low distortion, high gain, wide bandwidth and good DC performance, but poor slew rate performance. The class AB op-amp offers improved slew rate performance but poor noise and DC performance.

There is desired an improved op-amp that retains the advantages of these configurations and overcomes the disadvantages.

SUMMARY OF THE INVENTION

The present invention achieves technical advantages as a folded cascode op-amp using a hyperbolic cosine ("cosh") comparator for the biasing of the transistors, thus transforming the relationship of output current with respect to differential voltage input from a hyperbolic tangent function ("tanh") to a hyperbolic sine function ("sinh"). In this manner, the folded cascode op-amp has slew rate characteristics similar to a class AB op-amp but with low noise, low distortion and better DC performance. The transformation makes the conventional folded cascode op-amp very fast without affecting its desirable parameters of low noise, low distortion, high gain, wide bandwidth and good DC performance.

DETAILED DESCRIPTION OF TWO CONVENTIONAL AMPLIFIERS

Figure 1:
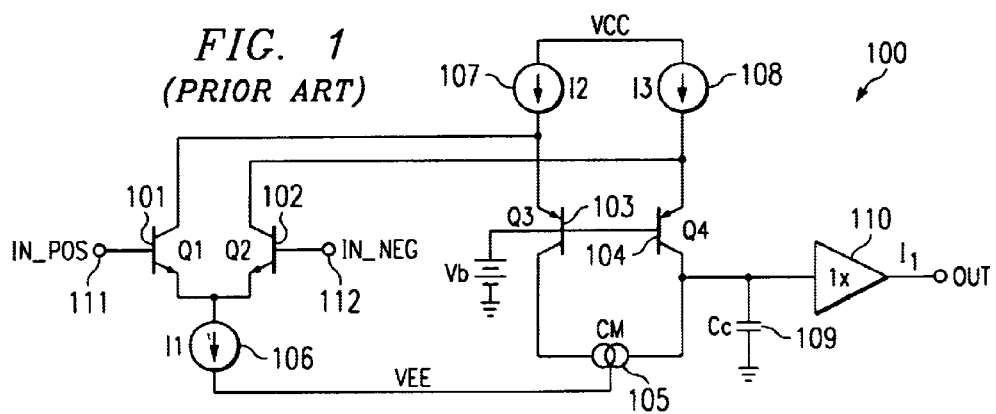
FIG. 1 is a schematic of a first conventional operational amplifier circuit configured as a folded cascode.

FIG. 1 is a schematic of a conventional folded cascode amplifier. The folded cascode amplifier is characterized by four transistors arranged whereby the collectors of the two input stage differential amplifier transistors are directly coupled to the emitters of the other two transistors, and the output is taken from the collector of one of the second set of transistors.

Figure 2:
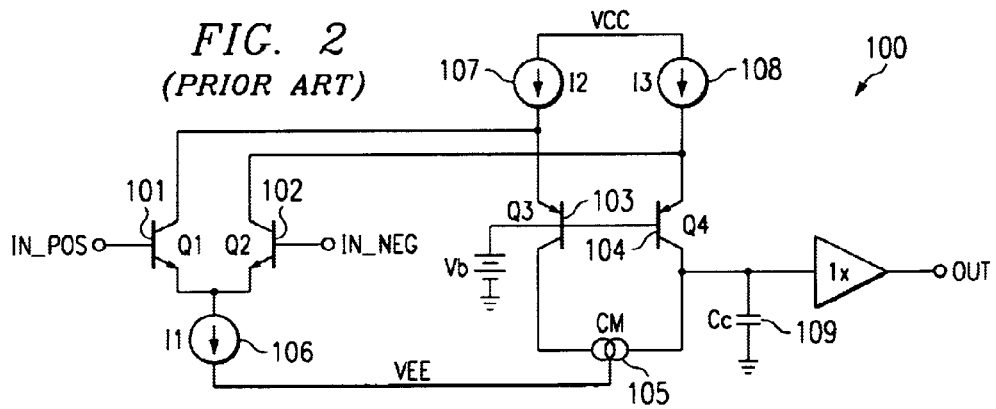
FIG. 2 is a schematic showing positive current flowing in the first conventional operational amplifier circuit of FIG. 1.
Figure 3:
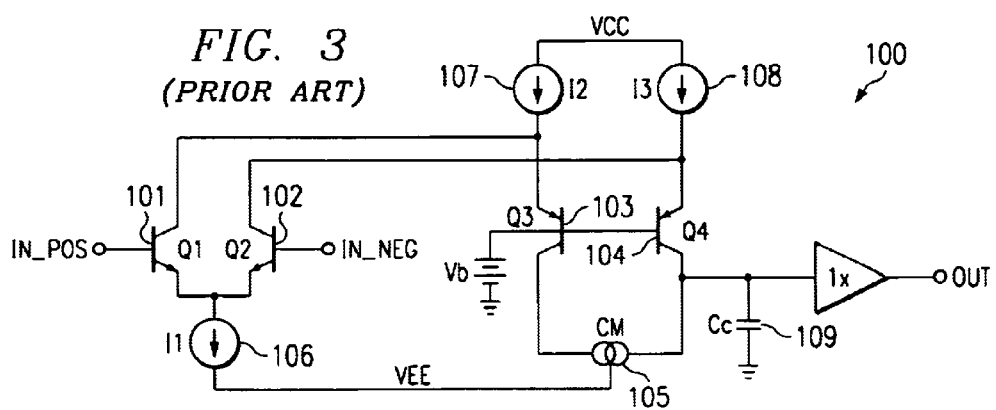
FIG. 3 is a schematic showing negative current flowing in the first conventional operational amplifier circuit of FIG. 1.

Specifically, the first conventional operational amplifier 100, configured as a folded cascode as shown in FIG. 1, is comprised of differential pair transistors 101 ("$Q_1$") and 102 ("$Q_2$"), two common base transistors 103 ("$Q_3$") and 104 ("$Q_4$"), a current mirror 105, three current sources 106 ("$I_1$"), 107 ("$I_2$") and 108 ("$I_3$"), a compensation capacitor 109 ("$C_c$"), and a buffer 110. As seen in FIGS. 2 and 3, during a large signal condition, current $I_c$, which is charging or discharging capacitor $C_c$ 105, will come from $I_3$-$I_{Q2}$ or $I_2$-$I_{Q1}$, (assuming that $I_1$, $I_2$ and $I_3$ are the same). For example, if transistor $Q_1$, 101 is on and transistor $Q_2$ 102 is off during a large transient signal, all of the current in current source $I_2$ 107 will flow through transistor $Q_1$ 101. This will turn off transistor $Q_3$ 103 leaving no current through current mirror 105. Since transistor $Q_2$ 102 is off, all of the current coming out of current source $I_3$ 108 will have to flow to capacitor $C_c$ 109 because current mirror 105 does not have any current as transistor $Q_3$ 103 is off. Similarly, as can be seen in FIG. 3, when transistor $Q_1$ 101 is off and transistor $Q_2$ 102 is on, all of the current from $I_3$ 108 will flow through transistor $Q_2$ 102 which turns off transistor $Q_4$ 104. Since transistor $Q_1$ 101 is off, all of the current from $I_2$ will flow through transistor $Q_3$ 103 and into current mirror 105, discharging capacitor $C_c$ 109. The slew rate limitation is due to current sources $I_1$ 106, $I_2$ 107, and $I_3$ 108 because these current sources can only provide a maximum amount of current in signal transitions.

By definition, slew rate is the rate of change of the output voltage of the circuit with respect to time when a step signal is applied to the circuit. Equation 1 describes slew rate of the circuit in FIG. 1 as follows:

$$SR = \frac{dV_{out}}{dt} = \frac{I_c}{C_c} \qquad 1.$$

where SR is slew rate, $C_c$ is the value of the compensation capacitor 109 and $I_c$, is the output current of the folded cascode op-amp. If the circuit shown in FIG. 1 is assumed to be a two pole amplifier with a phase margin of 45°, the compensation capacitor $C_c$ can be defined as follows:

$$C_c = \frac{gm}{2\pi f} \qquad 2.$$

where f is the frequency at unity gain for a phase margin of 45° and $g_m$ is the transconductance. Transconductance can be defined in terms of transistor parameters with the assumption of a small signal operation as follows:

$$gm = \frac{I_c}{2*V_T} \qquad 3.$$

where $V_T$ is the thermal voltage of a bipolar transistor and $I_c$, is the output current of the folded cascode op-amp. Increasing $I_c$ in Equation 3 will mean that transconductance will increase, which in turn will increase the required $C_c$ value, to keep bandwidth constant by the same amount. Conventionally, to increase the slew rate, the only parameter that can be adjusted is the transconductance by using emitter degeneration in transistors $Q_1$ 101 and $Q_2$ 102. This would result in a lower transconductance, which translates into a smaller $C_c$ value for the same bandwidth and $I_c$. Degenerating $Q_1$ 101 and $Q_2$ 102 will increase the slew rate but it will also decrease the open loop gain of the amplifier ($A_{vo}=g_m*R_{out}$), where $A_{vo}$ is open loop voltage gain, and will also increase noise.

Figure 4:
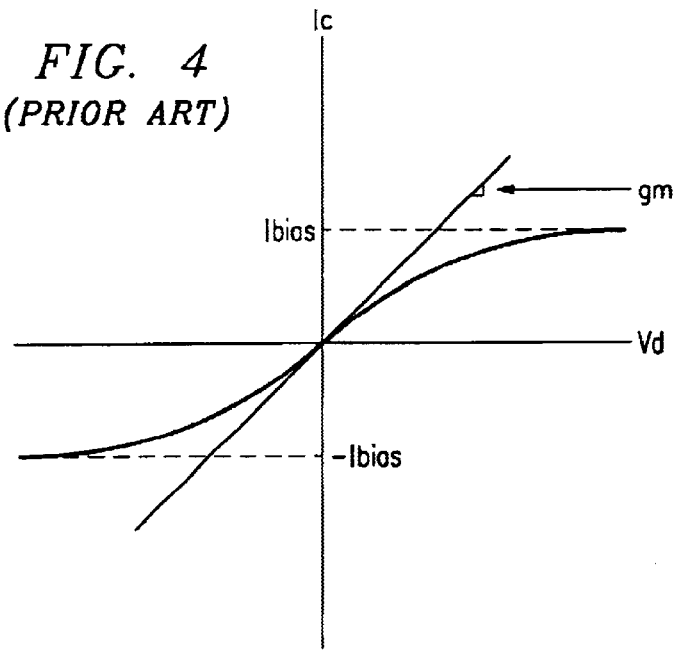
FIG. 4 is a hyperbolic tangent plot characteristic of the first conventional operational amplifier of FIG. 1.

The output current of the folded cascode op-amp of FIG. 1 is given by the following:

$$I_c = I_1 * \tanh\left(\frac{V_d}{2V_T}\right) \qquad 4.$$

where $V_d$ is the differential voltage between nodes 111 ("IN_POS") and 112 ("IN_NEG") and $I_1$ is the tail current. Equation 4 neglects errors due to β and Early voltage. As seen in the plot of Equation 4 as shown in FIG. 4, the current $I_c$ has a linear slope in a small range of $V_d$. This linear part of the plot provides the small signal transconductance that sets the open loop gain of the amplifier. When $V_d$ increases, the current $I_c$, approaches and becomes tangent to $I_1$. This illustrates the limitation in slew rate of a folded cascode op-amp. That is, there is only a maximum amount of current available to charge $C_c$, in a step signal transition. It should be noted that the small signal model of the transistor and hence, Equation 3, is no longer valid when $V_d$ is outside the linear part of the plot.

As noted, one disadvantage of the folded cascode op-amp 100 is poor slew rate performance because a folded cascode op-amp is biased in class A mode. As such, the current available to charge the compensation capacitor during signal transitions is limited to the biasing currents of the topology. Thus, the slew rate in a folded cascode is directly proportional to the output current of the op-amp.

As can be seen in FIG. 4, the relationship of output current with respect to differential voltage of the folded cascode circuit 100 of FIG. 1 has a tanh-like function. As noted from the plot, the larger the differential input voltage, the closer its output current gets to the absolute value of the biasing current. This current charges the compensation capacitor. Because the charging current is limited, the slew rate will also be limited, making this a first-order limitation in a regular folded cascode op-amp.

Figure 5:
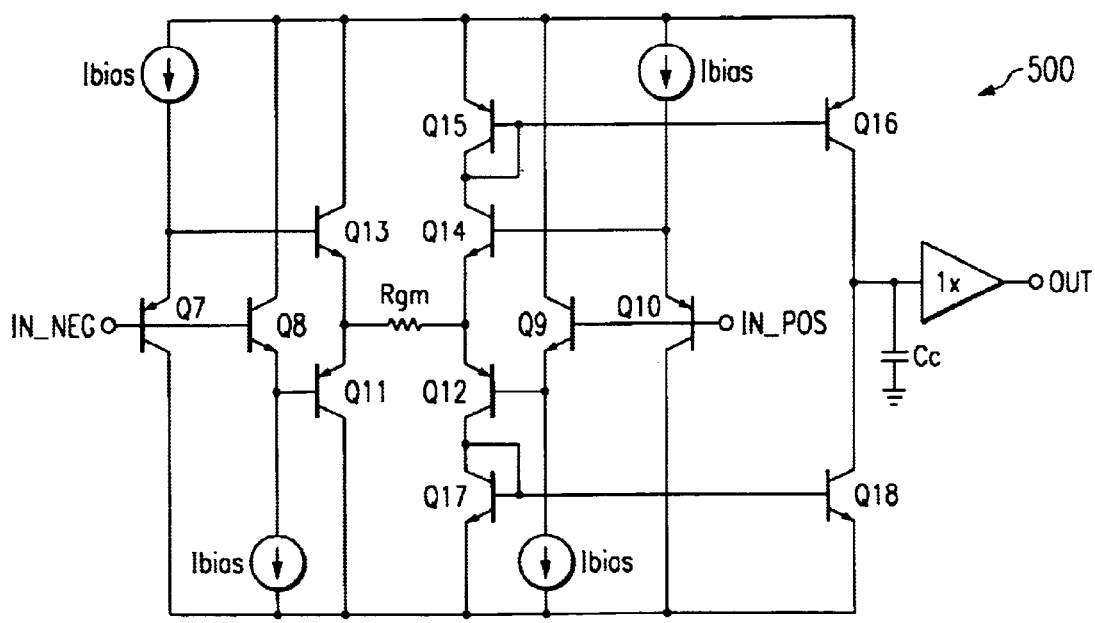
FIG. 5 is a schematic of a simplified class AB op-amp circuit used as an input stage to generate a sinh output.

One conventional solution employed to overcome the slew rate problem is to use a class AB op-amp instead of a folded cascode op-amp. FIG. 5 is a schematic of simplified class AB circuit topology 500 used as the input stage in an op-amp. Unlike the folded cascode, the circuit of FIG. 5 theoretically provides unlimited current to charge the compensation capacitor. The two primary disadvantages to the simplified class AB topology is poor noise and DC performance. Poor noise performance is inherent in this topology because it has more transistors at its input. DC performance such as CMRR and input offset voltage are also degraded due to the nature of the topology. Improving DC performance in the class AB mode depends primarily on matching the npn transistors and pnp transistors in almost every parameter.

DETAILED DESCRIPTION OF THE PRESENT INVENTION

Figure 9:
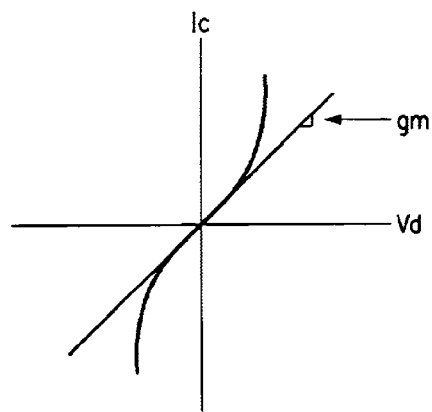
FIG. 9 is a hyperbolic sine plot of the relationship of output current with respect to differential voltage input.
Figure 8:
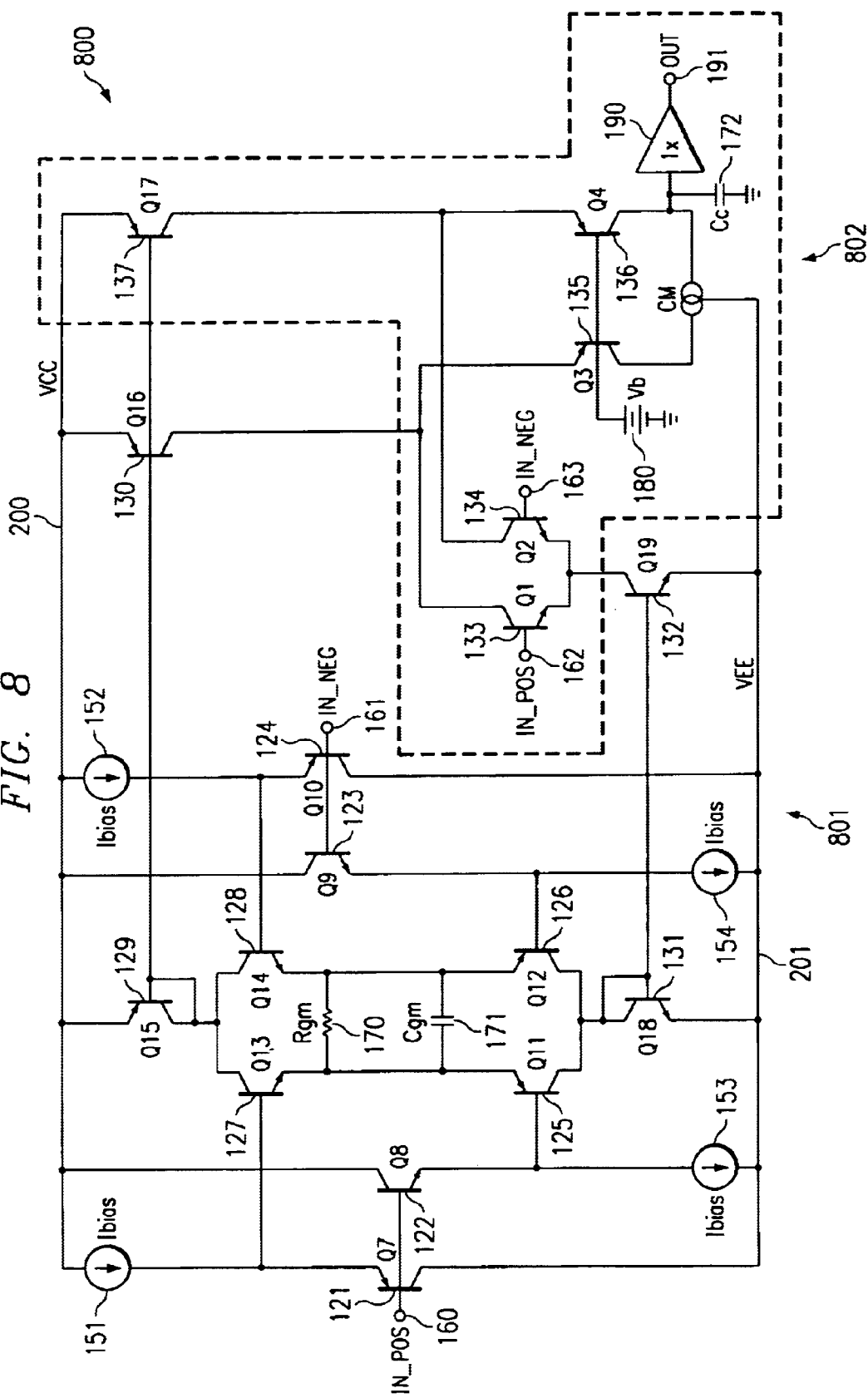
FIG. 8 is a schematic of the present invention.

The present invention overcomes the disadvantages of the separate folded cascode and the class AB configurations as a combined op-amp shown at 800 in FIG. 8. Specifically, the present invention advantageously makes current sources $I_1$, $I_2$, and $I_3$ shown in FIG. 1 a function of differential voltage $V_d$ such that when the absolute value of $V_d$ increases, so does current sources $I_1$, $I_2$ and $I_3$. Ideally, this solution provides infinite slew rate, and lower distortion, in a folded cascode op-amp without changing its small-signal transconductance $g_m$ and small-signal bandwidth. Further, this solution only affects the behavior of the circuit in its non-linear portion. Mathematically, a multiplication of a tanh function by a cosh function will overcome the poor slew rate disadvantages of the conventional folded cascode op-amp, and realizes a hyperbolic sine function (sinh). As seen in FIG. 9, the higher the differential voltage, the higher the output current. Slew rate is no longer a first order limitation but a second order one determined by process parasitics.

Figure 6:
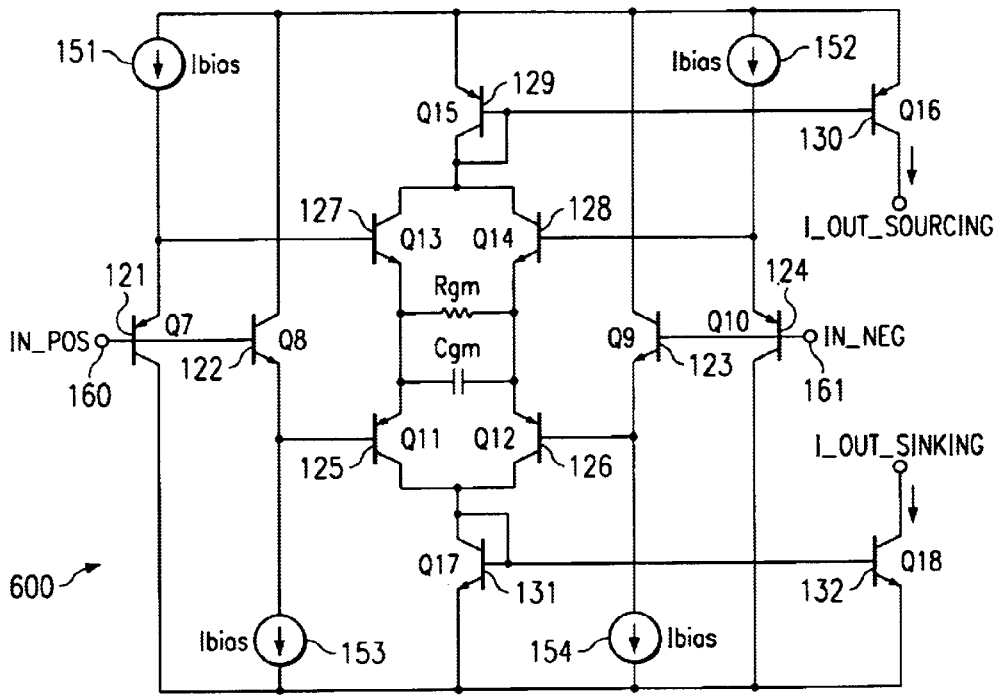
FIG. 6 is a schematic of a hyperbolic cosine comparator circuit.
Figure 7:
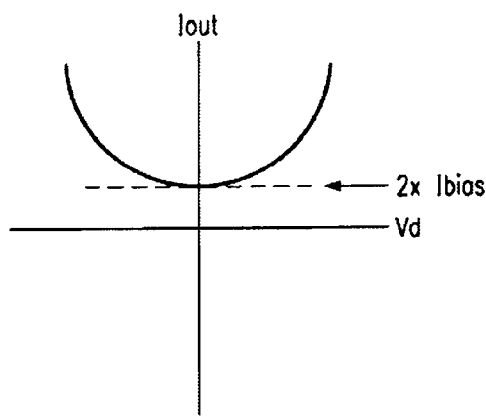
FIG. 7 is a hyperbolic cosine plot characteristic of the circuit of FIG. 6.

FIG. 6 is a schematic of a circuit 600 that realizes a cosh-like function. This circuit 600 compares the input voltages of an input signal at each of its input nodes and provides additional biasing current only in the falling and rising edges of the input signal. When the voltage difference between the input nodes is zero, the circuit 600 will output a constant current value that is twice that of $I_{bias}$ 151, 152, 153 and 154 as seen in FIG. 7. To implement the present invention, the circuit 600, corresponding to circuit 801 in FIG. 8, is coupled to the class AB op-amp 802 as shown in FIG. 8. The two circuits are coupled at the collector of transistor 130 and the collector of transistor 132.

Referring to FIG. 6, the output currents $I_{out\_sourcing}$ and $I_{out\_sinking}$ with respect to the differential voltage ($V_d$) in the circuit give the following mathematical approximations:

$$I_{out\_sourcing} \approx 2 * I_{bias} \cosh\left(\frac{V_d - (I_{c127} - I_{c128})R}{V_T}\right) \qquad 5.$$

$$I_{out\_sinking} \approx 2 * I_{bias} \cosh\left(\frac{V_d - (I_{c125} - I_{c126})R}{V_T}\right) \qquad 6.$$

where $I_{c125}$, $I_{c126}$, $I_{c127}$ and $I_{c128}$ are collector currents of transistors 125, 126, 127 and 128, respectively, and R is value of the resistor that controls the amount of current in signal transitions.

In order to combine Equations 4, 5 and 6 above, Equations 5 and 6 must be placed in terms of the biasing current $I_1$ (referred to as the tail current in Equation 4):

$$I_{bias} = \frac{I_1}{2} \qquad 7.$$

where $I_{bias}$ is as shown in FIG. 6. Combining Equations 5, 6, 7, results in Equations 8 and 9 as follows:

$$I_{out\_sourcing} \approx I_1 \cosh\left(\frac{V_d - (I_{c127} - I_{c128})R}{V_T}\right) \qquad 8.$$

$$I_{out\_sinking} \approx I_1 \cosh\left(\frac{V_d - (I_{c125} - I_{c126})R}{V_T}\right) \qquad 9.$$

where $I_{out\_sourcing}$, $I_{out\_sinking}$, $V_d$, $I_{c127}$, $I_{c128}$, R, $V_T$, $I_{c125}$ and $I_{c126}$ are made with reference to FIG. 6 and $I_1$ is the tail current referenced in Equation 4. Equations 8 and 9 are substantially the same, the only difference being that one sources current while the other sinks current. The following analysis is based on Equation 9 because Equation 8 simply complements the dynamics of the folded cascode of Equation 9. As noted in the plot of FIG. 7, the output current increases when $V_d$ goes positive or negative but when $V_d$ is zero, $I_{out}$ is two times $I_{bias}$ making the circuit operate in class AB mode.

Equation 9 can be combined with Equation 4 as follows:

$$I_c \approx I_1 \cosh\left(\frac{V_d - (I_{c125} - I_{c126})R}{V_T}\right) * \tanh\left(\frac{V_d}{2V_T}\right) \quad 10.$$

Equation 10 can be approximated numerically to a sinh-like function as seen in the plot of FIG. 9. As can be seen from Equation 10 and FIG. 9, the slope of the graph in its linear part is the same as in FIG. 4. This means that the small signal transconductance is the same for both circuits. The significant difference, advantageously, is that in FIG. 9 the current is not limited to the tail current $I_1$ when the folded cascode is operating outside its linear region. Advantageously, current increases infinitely as $V_d$ increases.

The present invention couples the cosh comparator circuit 600 of FIG. 6 to the folded cascode op-amp 100 of FIG. 1. This combination advantageously results in the class AB biased, folded cascode op-amp 800, shown in FIG. 8. As can be seen in the circuit 800 of FIG. 8, a capacitor ("$C_{gm}$") 171 is added to the circuit. This advantageously results in better slew rate performance at high frequencies. Current $I_c$, available to charge $C_c$ 172, has a symmetric path avoiding any delays or asymmetries in the transient response of the circuit.

Specifically, the circuit 800 of FIG. 8, comprises four input nodes 160, 161, 162 and 163, seventeen transistors 121, 122, 123, 124, 125, 126, 127, 128, 129, 130, 131, 132, 133, 134, 135, 136, and 137, one current mirror 181, four current sources 151, 152, 153 and 154, two capacitors 171 and 172, one resistor 170, a bias voltage source 180, a first voltage supply rail 200, a second voltage supply rail 201, a ground reference, and an output buffer circuit 190.

The first stage cosh comparator comprises twelve transistors 121, 122, 123, 124, 125, 126, 127, 128, 129, 130, 131 and 132, capacitor 171, resistor 170 and four current sources 151, 152, 153 and 154.

A signal is applied to the four input nodes, the positive input signal being applied to input nodes 160 and 162 and the negative input signal being applied to input nodes 161 and 163. Input node 160 is coupled to the bases of the first and second transistors 121 and 122. The emitter of the first transistor 121 is coupled to the base of the seventh transistor 127 and coupled to the first terminal of current source 151. The second terminal of current source 151 is coupled to the first voltage supply rail 200. The collector of the second transistor 122 is also coupled to the first voltage supply rail 200. The emitter of the second transistor 122 is coupled to the base of the fifth transistor 125. The first terminal of current source 153 is also coupled to the emitter of the second transistor 122. The second terminal of current source 153 is coupled to the second voltage supply rail 201. The collector of the first transistor 121 is coupled to the second voltage supply rail 201.

The collector of the seventh transistor 127 is coupled to the collector of the eighth transistor 128. The collector of the ninth transistor 129 is coupled to the collectors of the seventh transistor 127 and eighth transistor 128 and is also coupled to the base of the ninth transistor 129. The emitter of the ninth transistor 129 is coupled to the first voltage supply rail 200. The emitter of the seventh transistor 127 is coupled to the first terminal of resistor 170 ("$R_{gm}$") and is also coupled to the first terminal of capacitor 171 ("$C_{gm}$"). The emitter of the fifth transistor 125 is also coupled to the first terminal of $C_{gm}$ 171. The second terminal of $R_{gm}$ 170 is coupled to the emitter of the eighth transistor 128. The second terminal of $C_{gm}$ 171 is also coupled to the second terminal of $R_{gm}$ 170.

The emitter of the sixth transistor 126 is coupled to the second terminal of $C_{gm}$ 171. The collector of the sixth transistor 126 is coupled to the collector of the fifth transistor 125, and the collectors of the sixth transistor 126 and fifth transistor 125 are coupled to the collector of the eleventh transistor 131. The base of the eleventh transistor 131 is also coupled to the collector of the eleventh transistor 131. The emitter of the eleventh transistor 131 is coupled to the second voltage supply rail 201.

The first terminal of current source 154 is coupled to the base of the sixth transistor 126 and is also coupled to the emitter of the third transistor 123. The second terminal of current source 154 is coupled to the second voltage supply rail 201. The collector of the third transistor 123 is coupled to the first voltage supply rail 200. The base of the third transistor 123 is coupled to the base of the fourth transistor 124 which is coupled to the negative input node 161.

The emitter of the fourth transistor 124 is coupled to the base of the eighth transistor 128 and is also coupled to a first terminal of current source 152. The second terminal of current source 152 is coupled to the first voltage supply rail 200. The collector of the fourth transistor 124 is coupled to the second voltage supply rail 201.

The base of the ninth transistor 129 is coupled to the base of the tenth transistor 130. The emitter of the tenth transistor 130 is coupled to the first voltage supply rail 200. The base of the eleventh transistor 131 is coupled to the base of the twelfth transistor 132. The emitter of the twelfth transistor 132 is coupled to the second voltage supply rail 201.

The folded cascode second stage comprises five transistors 133, 134, 135, 136 and 137, voltage bias source 180, current mirror 181, compensation capacitor 172 ("$C_c$") and output buffer 190. The collector of the twelfth transistor 132 is coupled to the emitter of the thirteenth transistor 133 and the emitter of the fourteenth transistor 134. The second positive input node 162 is coupled to the base of the thirteenth transistor 133. The second negative input node 163 is coupled to the base of the fourteenth transistor 134. The collector of the thirteenth transistor 133 is coupled to the collector of the tenth transistor 130. The collector of the fourteenth transistor 134 is coupled to the collector of the seventeenth transistor 137. The base of the tenth transistor 130 is coupled to the base of the seventeenth transistor 137. The emitter of the seventeenth transistor 137 is coupled to the first voltage supply rail 200. The emitter of the fifteenth transistor 135 is coupled to the collector of the tenth transistor 130. The base of the fifteenth transistor 135 is coupled to the base of the sixteenth transistor 136. The emitter of the sixteenth transistor 136 is coupled to the collector of the seventeenth transistor 137. The collector of the fifteenth transistor 135 is coupled to a first output terminal of the current mirror 181 and the collector of the sixteenth transistor 136 is coupled to a second output terminal of the current mirror 181. The third terminal of the current mirror is coupled to the second voltage supply rail 201. The base of the fifteenth transistor 135 and the base of the sixteenth transistor 136 are coupled to the positive terminal of bias voltage source 180. The negative terminal of bias voltage source 180 is coupled to a ground reference.

$I_c$ flows out of the node connecting the collector of the sixteenth transistor 136 and the second current mirror terminal into the input of buffer 190. $C_c$ 172 is coupled to the input of buffer 190 and the second terminal of $C_c$ 172 is coupled to the ground reference. In operation, extra current is available to charge capacitor $C_c$ 172 during a voltage transition during non-linear operation, making the slew rate higher while maintaining the low distortion of the folded cascode. Advantageously, the slew rate is higher without affecting the small signal transconductance ($g_m$) of the folded cascode or the value of $C_c$ 172. An output terminal 191 is coupled to the output of the buffer 190.

Transistors 121, 124, 125, 126, 129, 130, 135, 136, and 137 comprise pnp transistors. Transistors 122, 123, 127, 128, 131, 132, 133 and 134 comprise npn transistors.

The use of the cosh comparator to bias transistors transforms the relationship of output current with respect to differential voltage input from a tanh relationship to a sinh relationship. This topology provides the folded cascode op-amp 802 with improved open loop gain, bandwidth, phase margin and CMRR, and low input offset voltage and input voltage noise. The topology is suitable for use in high speed analog circuits.

What is claimed is:

1. An operational amplifier, comprising:
    a first stage configured as a cosh comparator circuit operable to provide a cosh output;
    a second stage configured as a folded cascade circuit operable to provide a tanh output; and
    circuitry coupling the first stage to the second stage operable to provide a sinh output.

2. The operational amplifier recited in claim 1, wherein the operational amplifier comprises a high speed, low distortion voltage feedback operational amplifier.

3. The operational amplifier recited in claim 1 for use in an integrated circuit.

4. The operational amplifier recited in claim 1, further comprising:
    a plurality of transistors and current sources in the first stage operable to provide a cosh output;
    a plurality of transistors and current sources in the second stage operable to provide a tanh output;
    the transistors and current sources of the first stage being adapted to provide biasing of the plurality of transistors in the second stage; and
    the first stage being coupled to the second stage operable to provide a sinh output.

5. The operational amplifier recited in claim 1, wherein the operational amplifier comprises a high speed, low distortion voltage feedback operational amplifier.

6. The operational amplifier recited in claim 1 for use in a digital circuit.

7. An operational amplifier, comprising:
    a first stage comparator circuit for comparing an input differential voltage against a predetermined voltage level;
    the first stage comparator circuit providing biasing current to a second stage folded cascade circuit; and
    the first stage comparator circuit providing additional biasing current to a second stage folded cascode circuit only in the falling and rising edges of an input signal; wherein:
        the first stage comparator circuit is operable to provide a cosh output;
        the second stage folded cascode circuit is operable to provide a tanh output; and
        circuitry coupling the first stage to the second stage is operable to provide a sinh output.

8. The operational amplifier recited in claim 7, further comprising circuitry adapted to provide an output current from the first stage comparator circuit that is two times the biasing current when the input differential voltage is zero.

9. The operational amplifier recited in claim 7 for use in an integrated circuit.

10. An operational amplifier, comprising:
    a plurality of transistors and a plurality of current sources in a first stage adapted to provide a cosh biasing output;
    a plurality of transistors in a second stage receiving the cosh biasing output being configured as a folded cascode; and
    the first stage being coupled to the second stage operable to provide a sinh output with high slew rate, low distortion, low voltage noise, low input offset voltage, extended open loop gain, extended bandwidth, and improved CMRR characteristics.

11. An operational amplifier, comprising:
    a first stage comprising a plurality of transistors adapted to provide biasing current, the first stage comprising a cosh comparator of six pnp transistors, six npn transistors and four current sources, being configured to realize a cosh output current to differential input voltage relationship;
    the second stage biased by the first stage comprising a folded cascode adapted to drive an external load;
    the second stage folded cascode comprising three pnp transistors, two npn transistors, a current mirror, a bias voltage source, a compensation capacitor and an output buffer, being configured to realize a tanh current output to input voltage relationship; and
    a circuit coupling the first stage cosh comparator to the second stage folded cascode so as to realize a sinh output current to differential input voltage relationship.

12. An operational amplifier, as recited in claim 11, further comprising a resistor and capacitor being configured in the cosh comparator first stage so as to improve the speed characteristics of the operational amplifier.

13. An operational amplifier, comprising:
    a circuit adapted to receive input signals to two positive input nodes and two negative input nodes;
    a first positive input node being coupled to the base of a first transistor and the base of a second transistor;
    the emitter of the first transistor being coupled to the base of a seventh transistor and to a terminal of a first current source;
    a second terminal of the first current source being coupled to a first voltage supply rail;
    the collector of the second transistor being coupled to the first voltage supply rail;
    the emitter of the second transistor being coupled to the base of a fifth transistor;
    a first terminal of a third current source being coupled to the emitter of the second transistor;
    a second terminal of a third current source being coupled to a second voltage supply rail;
    the collector of the first transistor being coupled to the second voltage supply rail;
    the collector of the seventh transistor being coupled to the emitter of an eighth transistor;
    the collector of a ninth transistor being coupled to the collector of the seventh transistor and the collector of the eighth transistor and also coupled to the base of the ninth transistor, the emitter of the ninth transistor being coupled to the first voltage supply rail;
    the emitter of the seventh transistor being coupled to a first terminal of a first resistor and also coupled to a first terminal of a first capacitor, the emitter of the fifth transistor being coupled to the first terminal of the first capacitor;

a second terminal of the first resistor being coupled to the emitter of the eighth transistor;

a second terminal of the first capacitor being coupled to the second terminal of the first resistor;

the emitter of the sixth transistor being coupled to the second terminal of the first capacitor;

the collector of a sixth transistor being coupled to the collector of the fifth transistor;

the collector of the fifth transistor being coupled to the collector of the eleventh transistor;

the base of an eleventh transistor being coupled to the collector of the eleventh transistor;

the emitter of the eleventh transistor being coupled to the second voltage supply rail;

a first terminal of a fourth current source being coupled to the base of the sixth transistor and coupled to the emitter of a third transistor;

the collector of the third transistor being coupled to the first voltage supply rail;

the base of the third transistor being coupled to the base of a fourth transistor and to a first negative input node;

the emitter of the fourth transistor being coupled to the base of the eighth transistor and to a first terminal of a second current source;

a second terminal of the second current source being coupled to the first voltage supply rail;

the collector of the fourth transistor being coupled to the second voltage supply rail;

a second terminal of a fourth current source being coupled to the second voltage supply rail;

the base of a ninth transistor being coupled to the base of a tenth transistor;

the emitter of the tenth transistor being coupled to the first voltage supply rail;

the base of an eleventh transistor being coupled to the base of a twelfth transistor;

the emitter of the twelfth transistor being coupled to the second voltage supply rail;

the collector of the twelfth transistor being coupled to the emitter of a thirteenth transistor and to the emitter of a fourteenth transistor;

a second positive input node being coupled to the base of the thirteenth transistor;

a second negative input node being coupled to the base of the fourteenth transistor;

the collector of the thirteenth transistor being coupled to the collector of the tenth transistor;

the collector of the fourteenth transistor being coupled to the collector of a seventeenth transistor;

the base of the tenth transistor being coupled to the base of the seventeenth transistor;

the emitter of the seventeenth transistor being coupled to the first voltage supply rail;

the emitter of a fifteenth transistor being coupled to the collector of the tenth transistor;

the base of the fifteenth transistor being coupled to the base of a sixteenth transistor;

the emitter of the sixteenth transistor is coupled to the collector of the seventeenth transistor;

the collector of the fifteenth transistor being coupled to a first terminal of a current mirror and the collector of the sixteenth transistor being coupled to a second terminal of the current mirror;

a third terminal of the current mirror being coupled to the second voltage supply rail;

the bases of fifteenth transistor and the sixteenth transistor being coupled to a positive terminal of a bias voltage source;

a negative terminal of the bias voltage source being coupled to a ground reference;

a first terminal of a compensation capacitor being coupled to the input of a buffer and the second terminal of the compensation capacitor being coupled to a ground reference; and an output terminal being coupled to the output of the buffer.

14. An operational amplifier as recited in claim 13, further comprising the first, fourth, fifth, sixth, ninth, tenth, fifteenth, sixteenth, and seventeenth transistors being pnp transistors and the second, third, seventh, eight, eleventh, twelfth, thirteenth and fourteenth transistors being npn transistors.

15. An operational amplifier as recited in claim 13 for use in an integrated circuit.

16. An operational amplifier as recited in claim 13 for use in a digital circuit.

17. A method of amplifying signals, comprising:

biasing a plurality of transistors in a cosh comparator first stage and a folded cascode second stage;

coupling the cosh comparator first stage to the folded cascode second stage;

inputting a voltage signal into the cosh comparator first stage;

transforming the inputted voltage signal to a current signal with a cosh voltage to current relationship;

conveying the current signal to the folded cascode second stage;

amplifying the current signal; and outputting the amplified current signal with a sinh input voltage to current output relationship.

* * * * *